(12) United States Patent
Zimmer et al.

(10) Patent No.: US 10,113,884 B2
(45) Date of Patent: Oct. 30, 2018

(54) DIVERSITY IN MAGNETIC SENSORS

(71) Applicant: Infineon Technologies AG, Neubiberg (DE)

(72) Inventors: Juergen Zimmer, Neubiberg (DE); Hansjoerg Kuemmel, Munich (DE); Harald Witschnig, Landskron (AT); Franz Jost, Stuttgart (DE); Hegedus Akos, Villach (HU); Konrad Kapser, Graefelfing (DE); Llorenç Vallmajó I Ribas, Munich (DE)

(73) Assignee: Infineon Technologies AG, Neubiberg (DE)

( * ) Notice: Subject to any disclaimer, the term of this patent is extended or adjusted under 35 U.S.C. 154(b) by 357 days.

(21) Appl. No.: 14/840,574

(22) Filed: Aug. 31, 2015

(65) Prior Publication Data

US 2017/0059360 A1    Mar. 2, 2017

(51) Int. Cl.
*G01D 5/16*    (2006.01)
*G01R 33/09*   (2006.01)

(52) U.S. Cl.
CPC ............. *G01D 5/16* (2013.01); *G01R 33/09* (2013.01); *G01R 33/098* (2013.01)

(58) Field of Classification Search
CPC ......... G01D 5/16; G01R 33/098; G01R 33/09
USPC ................................................. 324/207.21
See application file for complete search history.

(56) References Cited

U.S. PATENT DOCUMENTS 7,394,247 B1 * 7/2008 Guo ................... B82Y 25/00
                                                324/207.21

* cited by examiner

*Primary Examiner* — Melissa Koval
*Assistant Examiner* — Courtney McDonnough
(74) *Attorney, Agent, or Firm* — Schiff Hardin LLP

(57) ABSTRACT

A magnetic angle sensor including a first Wheatstone bridge circuit having a plurality of first magnetoresistive elements; and a second Wheatstone bridge circuit having a plurality of second magnetoresistive elements, wherein the plurality of second magnetoresistive elements have diversity with respect to the plurality of first magnetoresistive elements.

14 Claims, 12 Drawing Sheets

DIVERSITY IN MAGNETIC SENSORS

BACKGROUND

Magnetoresistive sensors can include anisotropic magnetoresistive (AMR), giant magnetoresistive (GMR), tunnel magnetoresistive (TMR) and other technologies, referred to collectively as XMR technologies. XMR sensors can be used for a variety of applications, including magnetic field and current sensors, speed sensors, rotation sensors, angle sensors, among others.

GMR and TMR sensors are based on magnetoresistive elements having a free layer, which aligns its magnetization with an external magnetic field, and a reference layer, which is not affected by the external magnetic field. The magnetization of the free layer rotates with respect to the reference layer, resulting in a change of the resistance of the magnetoresistive elements.

An angle sensor comprises two types of full bridges—a sine bridge and a cosine bridge—having reference magnetizations that are perpendicular with respect to one another. From the sine and cosine of these bridges an arc tangent can be calculated to obtain an angle of the external magnetic field. An AMR angle sensor has an angle uniqueness of 180 degrees due to the 90-degree uniqueness of the AMR effect with respect to a rotating external in-plane field, and GMR and TMR angle sensors have an angle uniqueness of 360 degrees. The GMR and TMR angle sensors, however, suffer from accuracy drift, especially at high magnetic fields in combination with high temperatures. AMR angle sensors, as opposed to GMR and TMR angle sensors, are therefore generally used in applications with high accuracy requirements.

An angle sensor, as opposed to a speed sensor, does not measure an external magnetic field's magnitude. An angle sensor's sine and cosine bridges output sine and cosine signals, respectively, for determining the external magnetic field's direction only. The angle sensor works in saturation mode; the magnetization of the free layer is saturated and follows the external magnetic field, but there is no information about the strength of the external magnetic field. A speed sensor measures the strength of the magnetic field and the sine. An angle sensor measures the direction of the external magnetic field, and the sine and cosine.

There is a need for an angle sensor with improved accuracy, especially for automotive safety applications. To achieve corresponding targets in terms of Automotive Safety Integrity Level (ASIL), different target parameters such as Failure In Time (FIT) rate, diagnostic coverage, Single Point Fault Metric (SPFM), Latent Point Fault Metric (LPFM), etc. have to achieve a predetermined value. For angle sensors, a typical safety goal guarantees an angle accuracy within a predefined time, for example, 5° deviation of the actual angle value detected in 5 ms. A problem to be overcome in guaranteeing the validity of the sensed angle value.

Diversity is an important element used to ensure a high functional safety level. Diversity in this context means that information is provided by different elements or technologies. This disclosure is directed to achieving diversity, by means other than merely doubling of sensor elements.

DETAILED DESCRIPTION

The present disclosure is directed to a magnetic angle sensor having a first Wheatstone bridge circuit having a plurality of first magnetoresistive elements, and a second Wheatstone bridge circuit having a plurality of second magnetoresistive elements, wherein the plurality of second magnetoresistive elements have diversity with respect to the plurality of first magnetoresistive elements. This diversity provides improved angle accuracy, which is especially important in automotive safety applications.

Figure 1A:
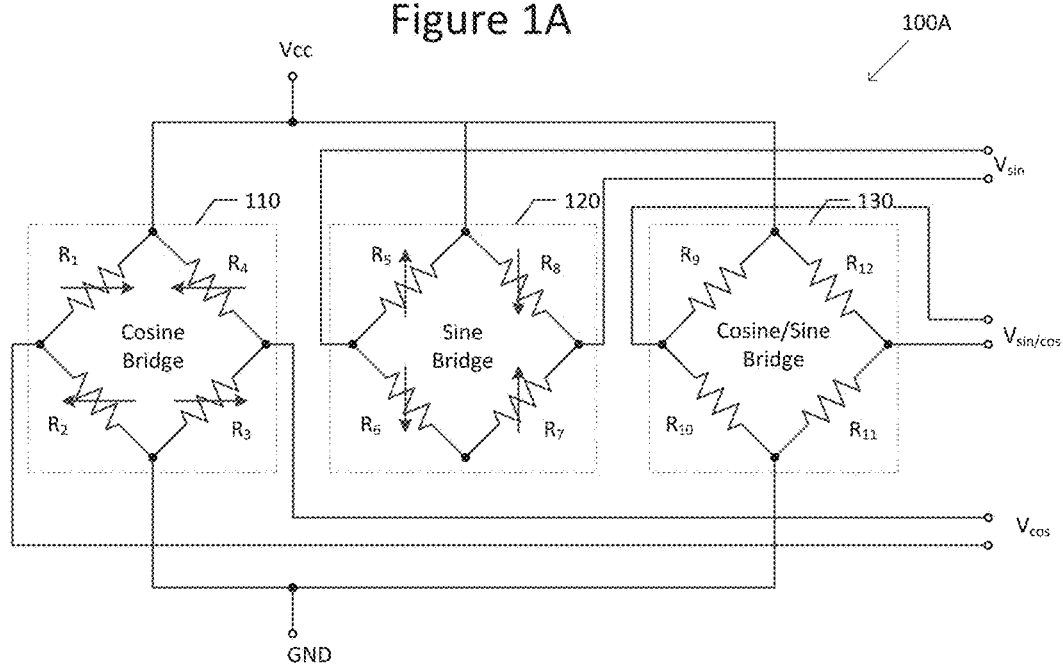
FIG. 1A illustrates a schematic diagram of a magnetic angle sensor in accordance with an exemplary embodiment.

FIG. 1A illustrates a schematic diagram of a magnetic angle sensor 100A in accordance with an exemplary embodiment. The magnetic angle sensor 100A achieves diversity by different magnetoresistive element layouts, more specifically, different Wheatstone bridge circuits having magnetoresistive elements with different meander stripe widths.

From a functional safety perspective, it is important to ensure that there is a minimum magnetic field strength to guarantee a specified angular accuracy. Since magnetic angle sensors generally function in a magnetically saturated mode, the magnetic field strength is not measurable directly.

The magnetoresistive elements of the Wheatstone bridge circuits of angle sensors have meander-like stripes with a certain width. Usually the stripe width is, for example, in a range of 10-40 µm in order to minimize shape anisotropy for a high accuracy angle sensor. A thin and long strip has a higher shape anisotropy. Higher shape anisotropy prevents the free magnetic layer from being well aligned with the external magnetic field. The lower the shape anisotropy, the lower the angle error.

This exemplary embodiment implements, besides high accuracy Wheatstone cosine and sine bridges, an additional Wheatstone bridge having magnetoresistive elements exhibiting a higher magnetic anisotropy realized by narrower meander stripe widths. For smaller field strengths, the magnetization of the free layer in the narrow structures is less well aligned to the external magnetic field, due to the high intrinsic anisotropy, but the signal output is reduced as compared with an output signal of the high accuracy bridges, in which the free layer magnetization follows the external magnetic field more closely, resulting in a high output signal even for smaller field strengths.

For the remainder of this description we shall assume first and second (high accuracy) Wheatstone Bridges provide high accuracy sine and cosine signals and an additional Wheatstone bridge of lower accuracy and hence having a higher shape anisotropy. The higher shape anisotropy may be preferably implemented using narrower meander strip width or strips. It is to be understood however, that first and second Wheatstone bridges might be also of lower accuracy than the further Wheatstone bridge, depending on circumstances. This is to say that first and second Wheatstone bridge would have a higher shape anisotropy than the further Wheatstone bridge. Again, the higher shape anisotropy may be implemented using narrower meander strip width than for the further Wheatstone bridge.

The magnetic angle sensor 100A comprises a first Wheatstone bridge 110, a second Wheatstone bridge 120, and a third Wheatstone bridge 130. A Wheatstone bridge is an electrical circuit used to measure an unknown electrical resistance by balancing two legs of a bridge circuit, one leg of which includes an unknown component. The operation of a Wheatstone bridge is well known, and for the sake of brevity, will not be described here.

The first Wheatstone bridge circuit 110 is a cosine bridge circuit, and has a plurality of first magnetoresistive elements $R_1$, $R_2$, $R_3$, $R_4$. The first Wheatstone bridge circuit 110 is coupled between supply voltage Vcc and ground GND, and is configured to output signal $V_{COS}$.

The second Wheatstone bridge circuit 120 is a sine bridge circuit, and has a plurality of second magnetoresistive elements $R_5$, $R_6$, $R_7$, $R_8$. The second Wheatstone bridge circuit 120 is coupled between supply voltage Vcc and ground GND, and is configured to output signal $V_{SIN}$.

The third Wheatstone bridge circuit 130 may be either a cosine bridge circuit, or alternatively, a sine bridge circuit, and has a plurality of third magnetoresistive elements $R_9$, $R_{10}$, $R_{11}$, $R_{12}$. The third Wheatstone bridge circuit 130 is coupled between supply voltage Vcc and ground GND, and is configured to output signal $V_{SIN/COS}$. The plurality of third magnetoresistive elements $R_9$, $R_{10}$, $R_{11}$, $R_{12}$ of the third Wheatstone bridge circuit have diversity with respect to first magnetoresistive elements $R_1$, $R_2$, $R_3$, $R_4$, and with respect to the second magnetoresistive elements $R_5$, $R_6$, $R_7$, $R_8$ in that they have higher magnetic anisotropy.

Figure 1B:
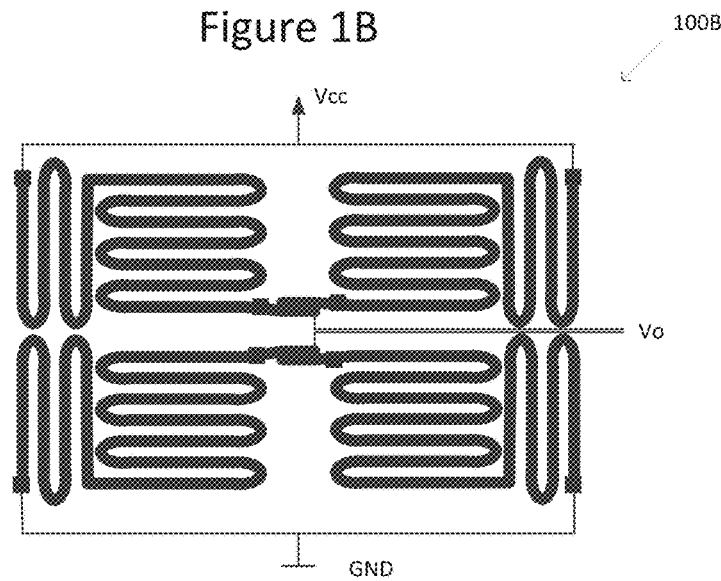
FIG. 1B illustrates a schematic diagram of a bridge of the magnetic angle sensor of FIG. 1A.

FIG. 1B illustrates a schematic diagram of a Wheatstone bridge 100B having four magnetoresistive elements of the magnetic angle sensor of FIG. 1A. The Wheatstone bridge 100B may be any of first Wheatstone bridge circuit 110, second Wheatstone bridge circuit 120, and third Wheatstone bridge circuit 130. In one embodiment each of the first Wheatstone bridge circuit 110 and the second Wheatstone bridge circuit 120 have magnetoresistive elements ($R_1$, $R_2$, $R_3$, $R_4$, and $R_5$, $R_6$, $R_7$, $R_8$, respectively) having meander stripes with a width of approximately 10 μm, and the additional, third Wheatstone bridge 130 with increased shape anisotropy has magnetoresistive elements $R_9$, $R_{10}$, $R_{11}$, $R_{12}$ with meander stripes having a width of less than approximately 3 μm. In an alternative embodiment the additional, third Wheatstone bridge circuit 130 has magnetoresistive elements $R_9$, $R_{10}$, $R_H$, $R_{12}$ with meander stripes having a width of less than approximately 1 μm.

Figure 1C:
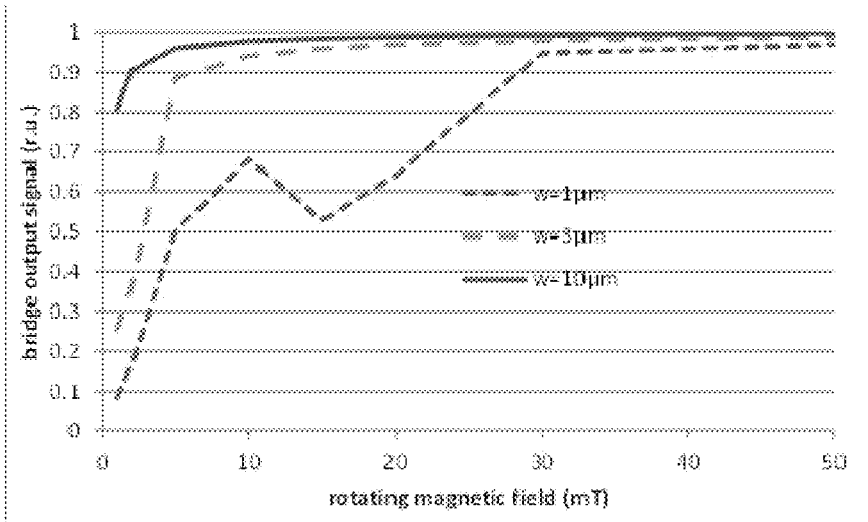
FIG. 1C illustrates a graph of Wheatstone bridge output signals of the magnetic angle sensor of FIGS. 1A and 1B versus rotating magnetic field.

FIG. 1C illustrates a graph 100C of Wheatstone bridge output signals of the magnetic angle sensor of FIGS. 1A and 1B versus an external magnetic field. The first Wheatstone bridge circuit 110 and the second Wheatstone bridge circuit 120, which has magnetoresistive elements with approximately 10 μm wide meander stripes, exhibit at 5 mT of magnetic field strength more than 95% of the possible output signal $V_{COS}$, $V_{SIN}$. At this point of 5 mT, the first and second Wheatstone bridge circuits 110, 120 are in saturation mode and follow the external magnetic field more precisely. On the other hand, the third Wheatstone bridge 130, which has magnetoresistive elements with meander stripes of approximately 1 μm in width, shows a slower increase in output signal $V_{COS/SIN}$ with respect to the magnetic field strength. More than 95% of the possible amplitude of the output signal is not reached until a magnetic field strength higher than 30 mT. For the smaller-width meander stripe, the output signal height or sensitivity of the angle sensor is decreased at lower levels, with the increase in height or sensitivity shifted to higher magnetic fields for magnetoresistive elements having meander stripe widths of 3 μm. At 5 mT there is 5-10% less signal as compared with the magnetoresistive elements having meander stripes widths of 10 μm, but the output signal increases when the rotating magnetic field is increases.

Figure 1D:
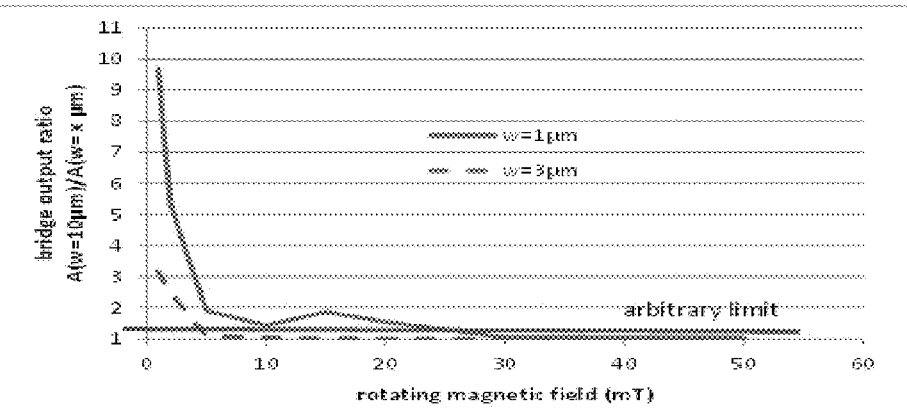
FIG. 1D illustrates a graph of magnetic angle sensor output signal ratios of the exemplary embodiment of FIGS. 1A and 1B versus rotating magnetic field.

FIG. 1D illustrates a graph 100D of ratios of the magnetic angle sensor output signals of the exemplary embodiment of FIGS. 1A and 1B versus rotating magnetic field.

In order for the first and second Wheatstone bridges 110, 120 to measure an angle accurately, these bridges must be in saturation. It could be that the magnet is positioned further away than thought, and thus the magnetic field strength is lower than expected. If the bridges are close to, but not quite in, saturation mode, the angle error could be significant.

Saturation mode of the first and second Wheatstone bridges 110, 120 can be confirmed based on the strength of the external magnetic field. The strength of the external magnetic field is not measurable directly. However, the strength can be estimated based on a ratio of the output signal of the lower accuracy third Wheatstone bridge circuit 130 to the output signal of one of the higher accuracy first or second Wheatstone bridge circuit 110, 120. Normally for angle sensors only the external magnetic field direction is detected, and there is no information about its strength. This ratio provides information about the magnetic field strength, thereby increasing functionalization.

Referring to the graph 100D, when the ratio is less than a predetermined value, it is determined that there is a minimum magnetic field strength required to ensure high accuracy of the angle measurement. If the third Wheatstone bridge 130 has meander stripe widths of 3 μm, an external magnetic field of approximately 10 mT is sufficient to achieve more than 95% of the output signal. In this case, the output signal ratio is less than a predetermined limit for smaller magnetic fields as compared with a case where the third Wheatstone bridge 130 has meander stripe widths of approximately 1 μm. By adjusting the meander stripe width, that is, by adjusting the magnetic shape anisotropy, of the third Wheatstone bridge 130, the minimum external magnetic field required for a high enough accuracy of the angle measurement can be shifted to a lower magnetic field value.

FIG. 2A-2F illustrate schematic diagrams of magnetic angle sensors 200A-200F in accordance with other exemplary embodiments. The magnetic angle sensors 200A-200F achieve diversity by using stacking and/or using magnetic angle sensors having different sensor technologies (e.g., AMR, TMR, or GMR).

Figure 2A:
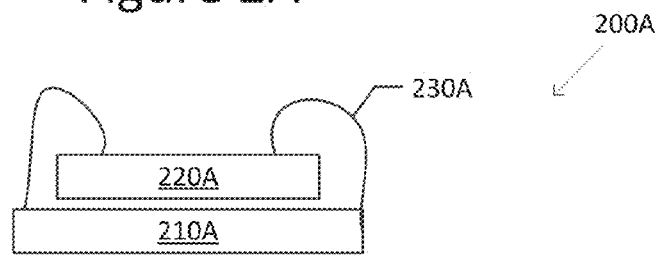
FIG. 2A-2F illustrate schematic diagrams of magnetic angle sensors in accordance with other exemplary embodiments.
Figure 2B:
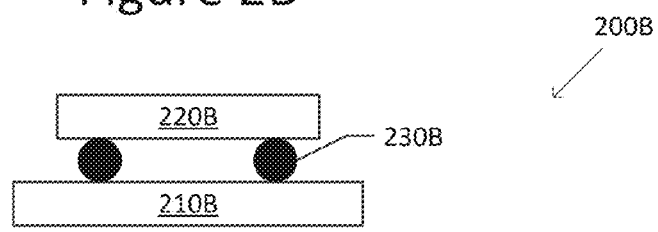

FIGS. 2A-2B illustrate exemplary embodiments of vertical chip stacking of sensor chips within one package to reduce lateral size and to provide a similar magnetic field for both sensor chips. The sensor chips can be based either on the same or on different sensor technologies (e.g., AMR, TMR, or GMR).

FIG. 2A illustrates a schematic diagram of a magnetic angle sensor 200A comprising a first angle sensor chip 210A and a second angle sensor chip 220A. The second angle sensor chip 220A is stacked vertically on the first angle sensor chip 210A within a same package. In this exemplary embodiment, the first angle sensor chip 210A and the second angle sensor chip 220A are coupled by wire bonding 230A.

FIG. 2B illustrates a schematic diagram of a magnetic angle sensor 200B comprising a first angle sensor chip 210B and a second angle sensor chip 220B. Like the magnetic angle sensor 200A of FIG. 2A, the magnetic angle sensor 220B has the second angle sensor chip 220B stacked vertically on the first angle sensor chip 210B within a same package. However, in this exemplary embodiment, the first angle sensor chip 210B and the second angle sensor chip 220B are coupled by metallic balls 230B using a flip-chip method.

FIGS. 2C-2F illustrate exemplary embodiments of magnetic angle sensors based on different sensor technologies (e.g., GMR, TMR, or AMR). Also, magnetic angle sensors 200C-200F differ from magnetic angle sensors 200A and 200B of FIGS 2A-2B in that rather than the sensors being stacked chip-on-chip, they are stacked monolithically, that is, on the same substrate, and are separated by an isolating dielectric layer. The GMR/TMR technologies offer full 360° uniqueness, whereas the AMR technology does not show any magnetically induced lifetime drift. Consequently, signals based on diverse technologies can be used to improve the accuracy of the sensor output signal.

Figure 2C:
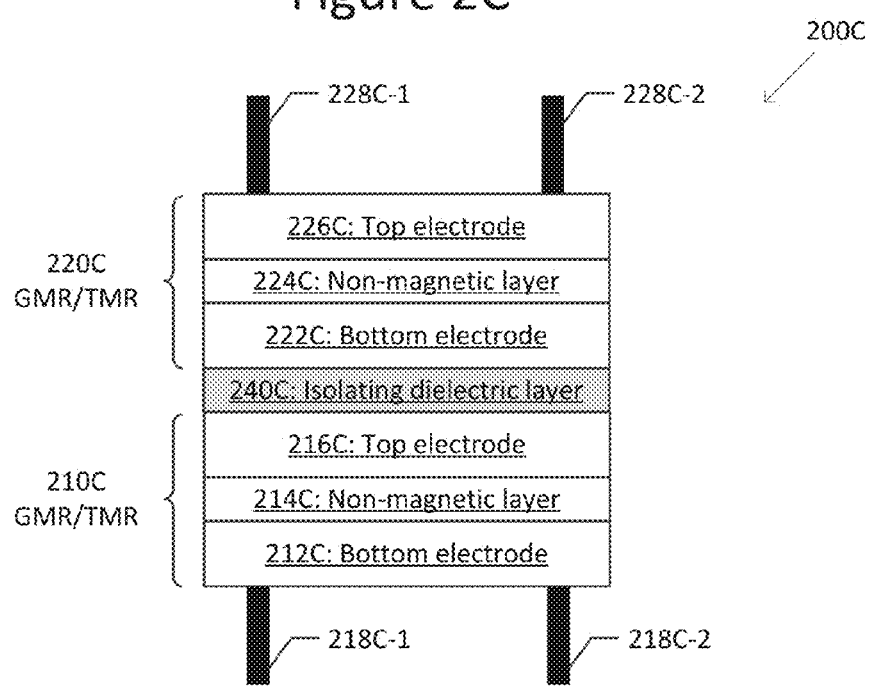

FIG. 2C illustrates a schematic diagram of a magnetic angle sensor 200C comprising GMR/TMR sensor stack 210C and GMR/TMR sensor stack 220C. The second angle sensor stack 220C is stacked on the first angle sensor stack 210C monolithically. An isolating dielectric layer 240C is located between the first angle sensor stack 210C and the second angle sensor stack 220C.

The first angle sensor stack 210C comprises a bottom electrode 212C and a top electrode 216C separated by a non-magnetic layer 214C. The first angle sensor stack 210C is electrically contacted at its bottom electrode 212C by terminals 218C-1 and 218C-2.

Similarly, the second angle sensor stack 220C comprises a bottom electrode 222C and a top electrode 226C separated by an isolating dielectric layer 224C. The second angle sensor stack 220C is electrically contacted at its top electrode 226C by terminals 228C-1 and 228C-2.

The first angle sensor stack 210C and the second angle sensor stack 220C are based on different sensor technologies. More specifically, the first angle sensor stack 210C is based on one of GMR and TMR technologies, and the second angle sensor stack 220C is based on the other of GMR and TMR technologies. GMR and TMR sensor stacks are similar with a bottom electrode, a top electrode, and a non-magnetic layer there between. However, in the case of a TMR sensor stack, there is a tunneling barrier comprised of, for example, magnesium oxide, and for GMR there is a non-magnetic conducting layer comprised of, for example, copper.

Each of the first and second angle sensor stacks 210C, 220C operate in a Current-In-Plane (CIP) configuration by the corresponding terminals. (CIP configuration is known, and for the sake of brevity, will not be described here). Usually, the first and second angle sensor stacks 210C, 220C are each operated with two terminal connections: the first angle sensor stack 210C is connected to a first electrical voltage at the first terminal 218C-1 and to a second electrical voltage at the second terminal 218C-2. The second angle sensor stack 220C is connected to further first electrical voltage at the first terminal 228C-1 and to a further second electrical voltage at the second terminal 228C-2. This contacting scheme leads to a potential distribution within each angle sensor stack to provide a current flow between the first and second terminal in the plane of the sensor stack (i.e. current-in-plane, CIP).

Figure 2D:
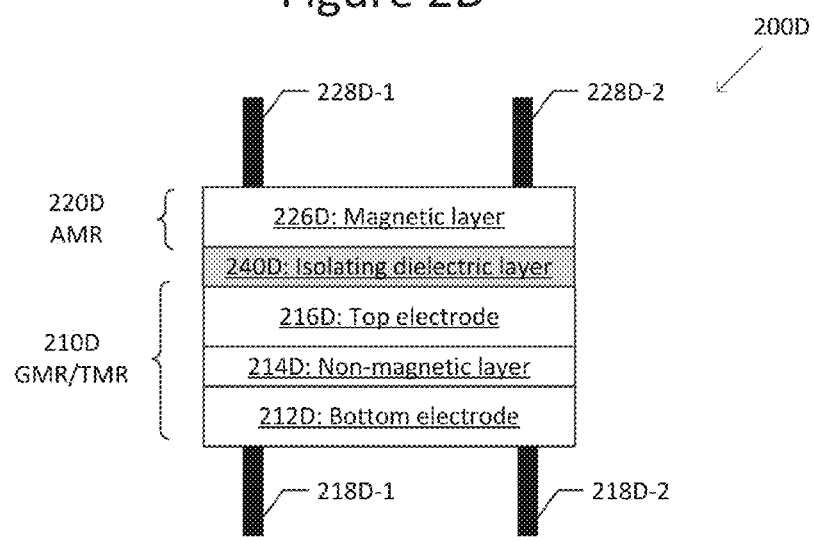

FIG. 2D illustrates a schematic diagram of a magnetic angle sensor 200D comprising a GMR/TMR sensor stack 210D and an AMR sensor stack 220D. The AMR sensor 220D stack is stacked on the GMR/TMR sensor stack 210C monolithically. An isolating dielectric layer 240D is located between the first angle sensor stack 210DC and the second angle sensor stack 220D.

The first angle sensor stack 210D comprises a bottom electrode 212D and a top electrode 216D separated by non-magnetic layer 214D. The first angle sensor stack 210D is electrically contacted at its bottom electrode 212D by terminals 218D-1 and 218D-2.

The second angle sensor stack 220D comprises a magnetic layer 226D comprised of, for example, nickel iron. The second angle sensor stack 220D is electrically contacted at its top electrode 226D by terminals 228D-1 and 228D-2.

The first angle sensor stack 210D and the second angle sensor stack 220D are based on different sensor technologies. More specifically, the first angle sensor stack 210D is based on either a GMR or TMR technology, and the second angle sensor stack 220D is based on an AMR technology. Each of the first and second angle sensor stacks 210D, 220D operates in CIP configuration by the corresponding terminals. Although a TMR stack is usually operated with terminals at the top and bottom electrode to enable a current perpendicular to the sensor stack plane (CPP configuration), also in the proposed CIP configuration provided herein a certain ratio of the current has a component perpendicular to the plane. Consequently, a CIP-TMR effect is measurable which can be in the range of approximately 50% of the CPP-configuration. The amount of current perpendicular to the plane in the CIP-configuration depends on the resistance ratio of the top electrode 216D and bottom electrode 212D and the lateral distance between the first terminal 218D-1 and the second terminal 218D-2. In the sensor 210D the current flows from terminal 218D-1 to terminal 218D-2, and in the sensor 220D from terminal 228D-1 to terminal 228D-2.

Figure 2E:
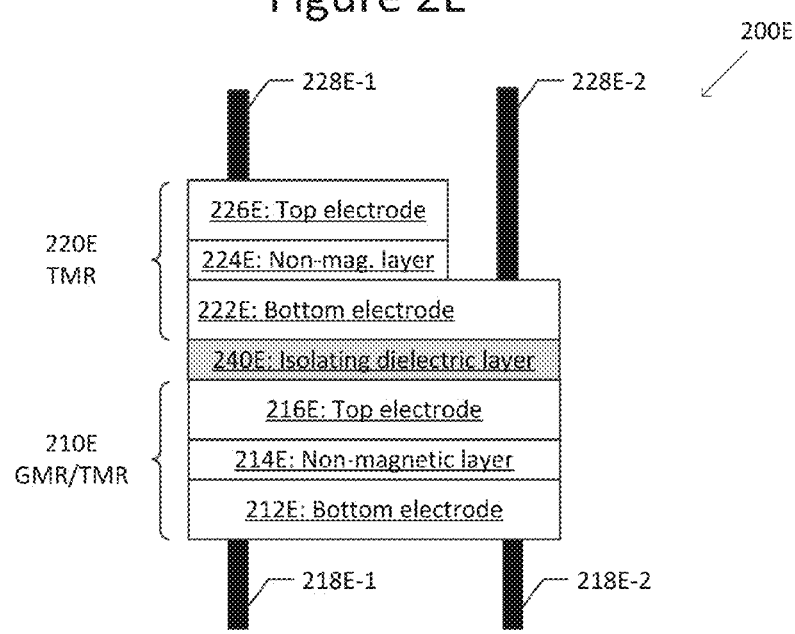

FIG. 2E illustrates a schematic diagram of a magnetic angle sensor 200E comprising a GMR/TMR sensor stack 210C and a TMR sensor stack 220E. An isolating dielectric layer 240E is located between the first angle sensor stack 210E and the second angle sensor stack 220E. The second angle sensor stack 220E is stacked on the first angle sensor stack 210E monolithically.

The first angle sensor stack 210E is based on either a GMR or TMR technology and operates in CIP configuration. The second angle sensor stack 220E is based on a TMR technology and operates in a Current Perpendicular to Plane (CPP) configuration. (CPP configuration is known, and for the sake of brevity, will not be described here.) As described above, the CPP configuration of a TMR sensor exhibits the full, maximum signal ratio.

The first angle sensor stack 210E comprises a bottom electrode 212E and a top electrode 216E separated by non-magnetic layer 214E. The first angle sensor stack 210E is electrically contacted at its bottom electrode 212E by terminals 218E-1 and 218E-2.

The second angle sensor stack 220E comprises a bottom electrode 222E and a top electrode 226E separated by a non-magnetic later layer 224E. The second angle sensor stack 220E is electrically contacted at its bottom electrode by terminal 228E-2 and at its top electrode by 228E-1.

The first angle sensor stack 210E and the second angle sensor stack 220E may be based on different sensor technologies. More specifically, the first angle sensor stack 210E is based on either of a GMR and TMR technology operated in CIP configuration, and the second angle sensor stack 220E is based on a TMR technology operated in CPP configuration.

The first angle sensor stack 210E operates in CIP configuration. Current is injected from terminal 218E-1, flows through the sensor stack laterally, and then flows down to the other terminal 218E-2. In case a TMR sensor stack is used, a portion of the current tunnels over the non-magnetic tunneling layer 214E, then flows in the top electrode 216E, and tunnels back over the non-magnetic tunneling layer 214E to the other terminal 218E-2. Thus, there is some current flowing in the top electrode 216E and some current flowing in the bottom electrode 212E, so there is a shorting in the top electrode 216E and bottom electrode 212E. As a result the TMR effect in the CIP configuration is lower than for the CPP configuration of the top sensor stack 220E.

The second angle sensor stack 220E has one contact region for the top electrode 226E and a second contact region for the bottom electrode 222E in order to enable operation in a CPP configuration, that is, perpendicular to the non-magnetic tunneling layer 224E, by the corresponding terminals 228E-1 and 228E-2. More specifically, the current flows from the terminal 228E-2 to the bottom electrode 222E, which is low ohmic compared with the tunneling resistance, and then all of the current tunnels through the non-magnetic layer 224E and to the terminal 228E-1. As a result, the full, maximum TMR signal ratio is measurable.

Figure 2F:
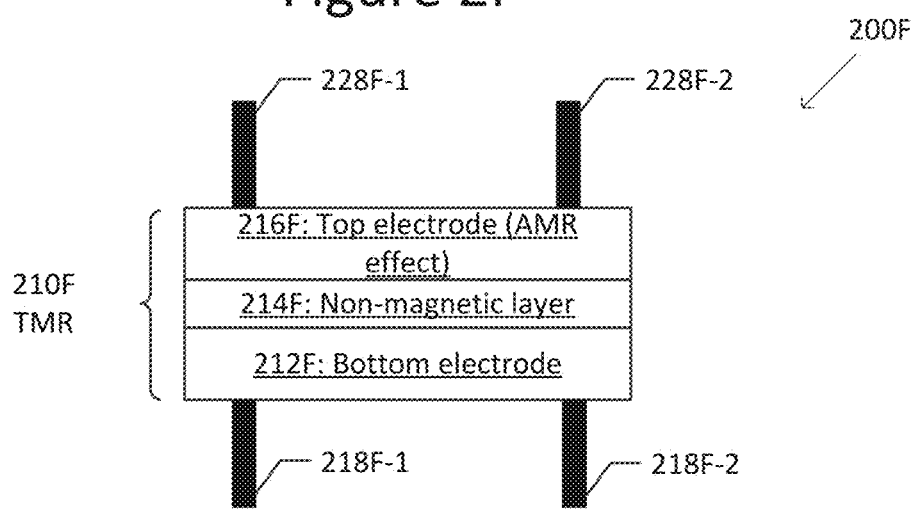

FIG. 2F illustrates a schematic diagram of a TMR magnetic angle sensor 200F in accordance with another exemplary embodiment. The TMR magnetic angle sensor 200F may be operated in CPP configuration for a TMR effect, or alternatively, in CIP configuration for an AMR effect, as described in detail below.

The magnetic sensor stack 210F is a TMR sensor stack comprising a bottom electrode 212F, a top electrode 216F, and a non-magnetic layer 214F located there between. The top electrode 216F is a free layer which has both TMR effect and AMR effect. The top electrode 216F may be comprised of, for example, nickel iron, and have a thickness of, for example, greater than 10 or 20 nm. Terminals 228F-1 and 228F-2 are coupled to the top electrode 216F. Terminals 218F-1 and 218F-2 are coupled to the bottom electrode 212F.

The magnetic angle sensor 200F may be configured to operate with an AMR effect. This is accomplished using only terminals 228F-1 and 228F-2, which are electrically coupled to the top electrode 216F, operating in a CIP configuration. The AMR effect is a bulk effect where the resistance of the top electrode 216F depends on the orientation between current direction and internal magnetization, and the angle between the current and magnetization directions modulates the resistance. If the lateral distance of the first terminal 228F-1 and second terminal 228F-2 is adjusted in the way that the resistance between the first and second terminal is much lower than the resistance of the second current path perpendicular to the sensor plane, then the CIP-TMR effect is negligible, resulting predominantly in an AMR effect based signal ratio when the first terminal 228F-1 and the second terminal 228F-2 are connected to a first and second voltage.

Alternatively, the sensor 200F may be configured to operate with a TMR effect. This is accomplished by coupling the terminals 228F-1 and 228F-2, which are coupled to the top electrode 216F, to be shorted to a first supply voltage (not shown), and coupling the terminals 218F-1 and 218F-2, which are coupled to the bottom electrode 212F, to be shorted to a second voltage (not shown). By separating the top terminals 228F-1, 228F-2 by a predetermined distance, only the CIP AMR effect is visible without the TMR effect. The predetermined distance between the top terminals 228F-1 and 228F-2 should be such that the amount of current flow over the non-magnetic tunneling barrier 214F is minimized as described above. Influencing factors of this amount of current flow are the sheet resistances of the bottom electrode 212F and/or the top electrode 216F, as well as the specific tunneling barrier resistance. Alternatively, the lateral distance of the first terminal 218F-1 and 218F-2 can be adjusted in that way, that a CIP-TMR effect is maximized to enable a TMR-effect sensor element.

The magnetic angle sensor 200F shows one angle sensor stack 210F as an example, but two or more angle sensor stacks 210F may be monolithically stacked. The angle sensor stacks 210F have a same structure as shown, but may be operated differently, either to have a TMR effect or an AMR effect. Different Wheatstone bridges comprising the angle sensor stacks 210F are configured to operate differently (TMR or AMR effect), thereby achieving diversity.

Figure 3A:
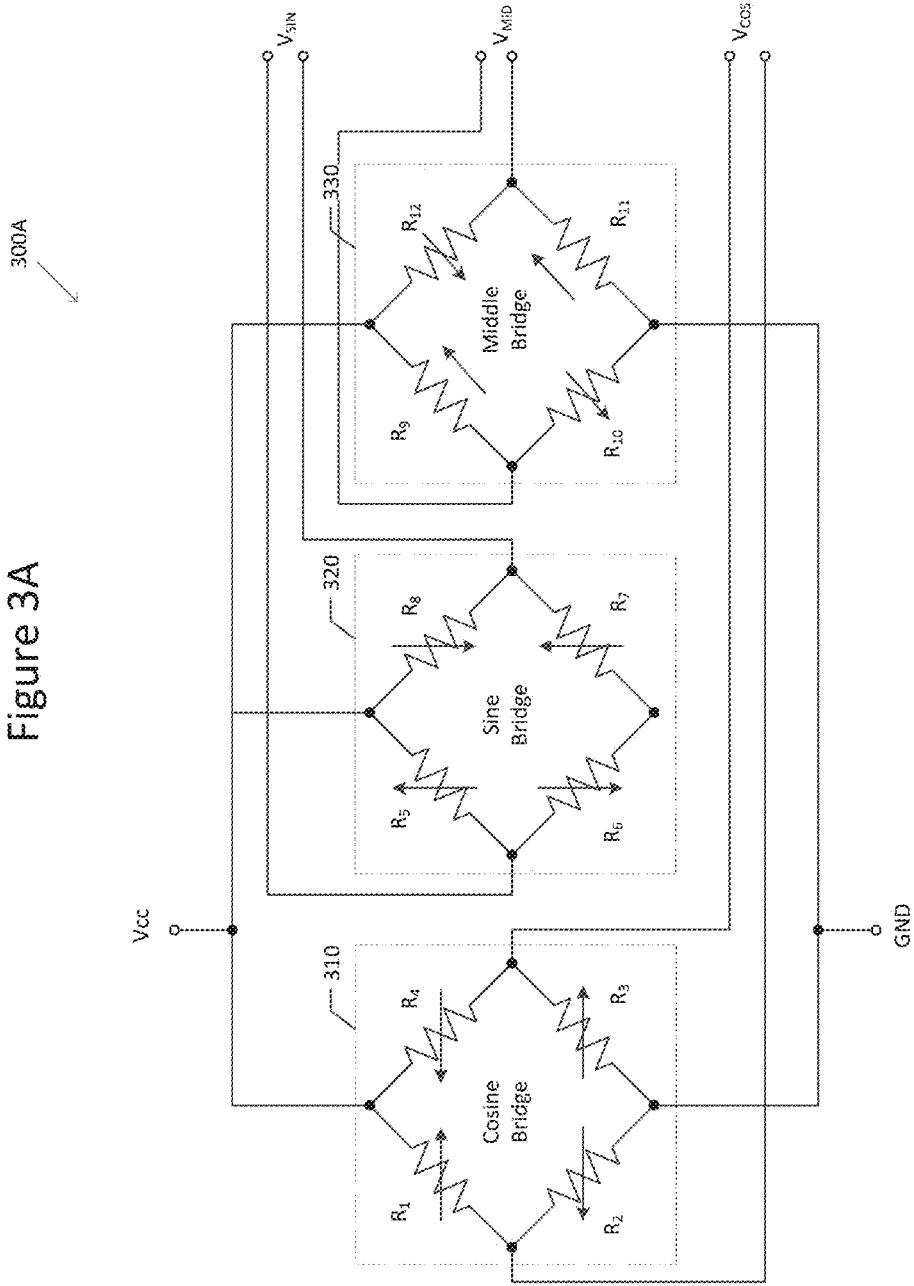
FIG. 3A illustrates a schematic diagram of a magnetic angle sensor in accordance with another exemplary embodiment.

FIG. 3A illustrates a schematic diagram of a magnetic angle sensor 300A in accordance with another exemplary embodiment. The magnetic angle sensor 300A achieves diversity by a combination of different output signals for Wheatstone bridge circuits.

The magnetic angle sensor 300A comprises a first Wheatstone bridge circuit 310, a second Wheatstone bridge circuit 320, and a third Wheatstone bridge circuit 330. Each of the Wheatstone bridge circuits is comprised of XMR elements, that is, either AMR, GMR or TMR elements.

The first Wheatstone bridge circuit 310 is a cosine bridge circuit, and has a plurality of first magnetoresistive elements $R_1$, $R_2$, $R_3$, $R_4$. The first Wheatstone bridge circuit 310 is coupled between supply voltage Vcc and ground GND, and is configured to output signal $V_{COS}$.

The second Wheatstone bridge circuit 320 is a sine bridge circuit, and has a plurality of second magnetoresistive elements $R_5$, $R_6$, $R_7$, $R_8$. The second Wheatstone bridge circuit 320 is coupled between supply voltage Vcc and ground GND, and is configured to output signal $V_{SIN}$.

Known angle sensors typically include the first, cosine Wheatstone bridge circuit 310 and the second, sine Wheatstone bridge circuit 320, which is rotated counter-clockwise one quarter of a period (i.e., 90° for GMR and TMR, and 45° for AMR) relative to the cosine bridge circuit 310 regarding the reference directions of the magnetoresistive elements. An angle θ of the external magnetic field can be determined by a microprocessor based on the output signals of the cosine bridge circuit 310 and the sine bridge circuit 320. More specifically, the external magnetic field angle θ is obtained by applying the Arctangent function to a ratio of the sine and cosine output signals, typically by a microprocessor, in accordance with the following equation:

$$\phi = \tan^{-1}(V_{SIN}/V_{COS}), \quad \text{(Equation 1)}$$

where φ=2θ(AMR) or φ=θ(GMR, TMR).

Figures 3B, 3C, 3D:
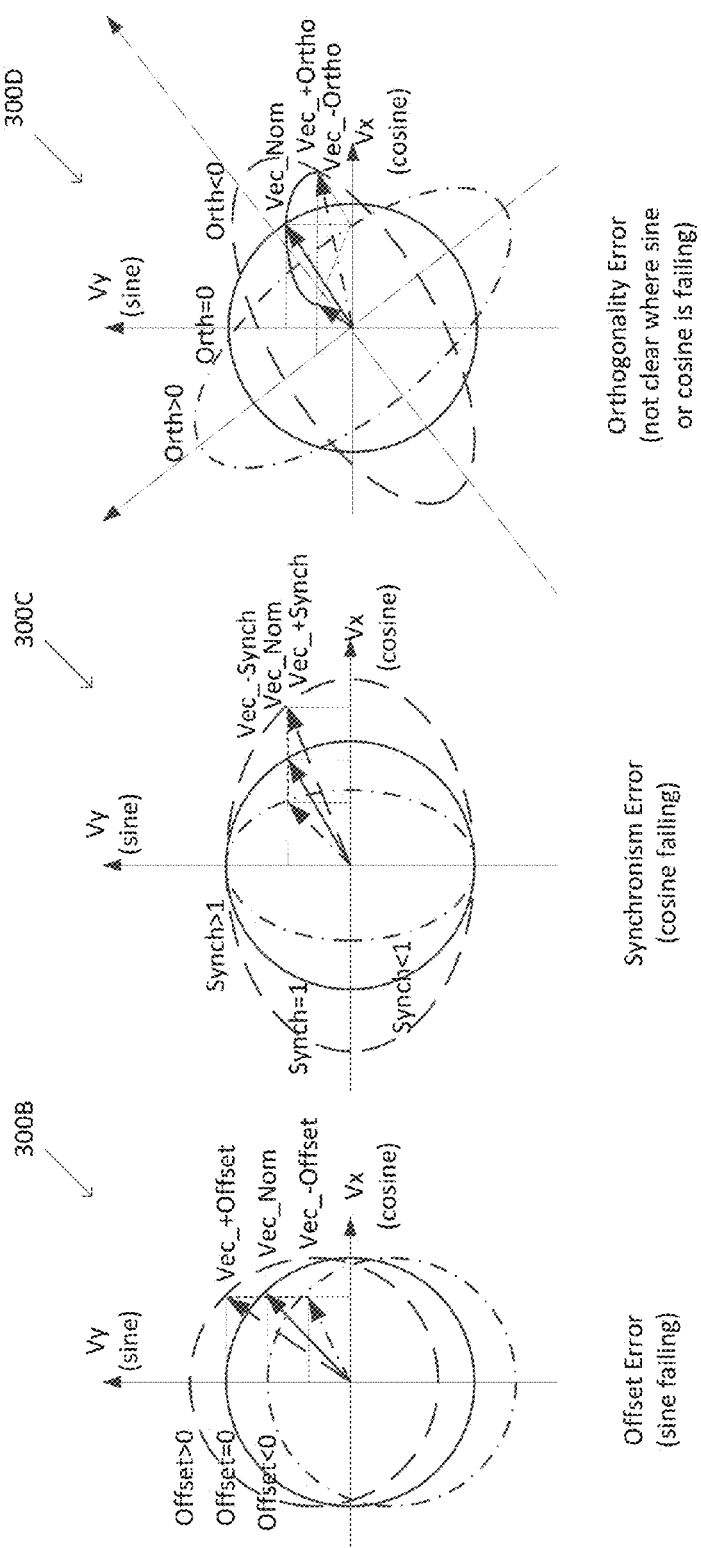
FIG. 3B illustrates graph of offset error of the magnetic angle sensor of FIG. 3A.
FIG. 3C illustrates a graph of synchronism error of the magnetic angle sensor of FIG. 3A.
FIG. 3D illustrates a graph of orthogonality error of the magnetic angle sensor of FIG. 3A.

FIGS. 3B-3D illustrate graphs 300B-300D of possible magnetic angle sensor errors that could result in an angle error. If an error occurs in any of the cosine bridge circuit 310 and the sine bridge circuit 320, the angle measurement θ of the external magnetic field is affected. These possible magnetic angle sensor errors include, but are not limited to, offset (FIG. 3B), synchronism (FIG. 3C), orthogonality (FIG. 3D), and electrical failures such as a bridge circuit having an open circuit or short circuit.

The graphs 300B, 300C, 300D shows the cosine bridge circuit output signal on the x-axis and the sine bridge circuit output signal on the y-axis. A circle centered at the origin indicates that the cosine bridge circuit 310 and the sine bridge circuit 310 are functioning properly. An ellipsis rather than a circle, or an offset from the origin, may indicate that at least one of the cosine bridge circuit 310 and sine bridge circuit 320 is failing.

FIG. 3B illustrates graph 300B of offset error, which may be caused by unmatched, magnetoresistive element drifts, and results in a voltage offset. The solid circle indicates that both the cosine and sine bridge circuits 310, 320 are functioning properly. The dashed circle is offset in the positive y direction, and the dashed-dotted circle is offset in a negative y direction, which in either case may indicate that the sine bridge circuit 320 is failing. If the cosine bridge circuit 310 were failing, the circle would be offset in either the positive or negative x direction.

FIG. 3C illustrates graph 300C of synchronism error, which may be caused by unmatched magnetoresistive effect drifts in the bridge circuits, and results in alteration of output signal amplitudes. The solid circle indicates that both the cosine and sine bridge circuits 310, 320 are functioning properly. The dashed ellipse with the axis in the x direction lengthened, and the dashed-dotted ellipse with the axis in the x direction shortened, may indicate that the cosine bridge circuit 310 is failing. If the sine bridge circuit 320 were failing, the axis would have been lengthened or shortened in the y direction.

FIG. 3D illustrates graph 300D of orthogonality error, which may be caused by a drift of a reference layer's orientation in the case of GMR or TMR elements. If the drift occurs in an unmatched manner for the cosine and sine bridge circuits, a phase error difference arises. The solid circle indicates that both the cosine and sine bridge circuits 310, 320 are functioning properly. The dashed ellipse with the longer axis running from the upper right to the lower left, and the dashed-dotted ellipse with the longer axis running from the upper left to the lower right, may indicate that one of the cosine and sine bridge circuits 310, 320 is failing, though there is no indication as to which of these bridge circuits 310, 320 is failing.

An investigation into which of the cosine bridge circuit 310 and the sine bridge circuit 320 is failing can be carried out using the middle bridge circuit 330. In the case of orthogonal error, it is not clear which of the bridge circuits is failing, so the failure can be investigated by replacing each of the output signals of the cosine bridge circuit 310 and the sine bridge circuit 320 with the output signal of the middle bridge circuit 330.

Referring back to FIG. 3A, the third Wheatstone bridge circuit 330 is added not only for error detection, but also for error correction. This third Wheatstone bridge circuit 330 is a middle bridge circuit having an orientation that is half way between the cosine and sine bridge circuits, and has a plurality of third magnetoresistive elements $R_9$, $R_{10}$, $R_{11}$, $R_{12}$. More specifically, the third Wheatstone bridge circuit 330 has an orientation that is rotated counter clockwise one eighth of a period relative to the cosine bridge circuit 310, while being at the same angular distance clockwise from the sine bridge circuit 320 (i.e., 45° for GMR and TMR, 22.5° for AMR). The third Wheatstone bridge circuit 330 is coupled between supply voltage Vcc and ground GND, and is configured to output signal $V_{MID}$.

If either of the cosine Wheatstone bridge circuit 310 or the sine Wheatstone bridge circuit 320 fails, the middle Wheatstone bridge circuit 330 may substitute for the failed cosine Wheatstone bridge circuit 310 or sine Wheatstone bridge circuit 320 in accordance with the following equations:

$$V_{COS} = A \cdot \cos \varphi, \quad \text{(Equation 2)}$$

$$V_{SIN} = A \cdot \sin \varphi, \quad \text{(Equation 3)}$$

$$V_{MID} = A \cdot \cos(\varphi - \pi/4) = A/\sqrt{2} \cdot (\cos \varphi + \sin \varphi), \quad \text{(Equation 4)}$$

$$V'_{SIN} = \sqrt{2} \cdot V_{MID} - V_{COS}, \text{ and} \quad \text{(Equation 5)}$$

$$V'_{COS} = \sqrt{2} \cdot V_{MID} - V_{SIN}, \quad \text{(Equation 6)}$$

where $V_{COS}$ is an output signal of the cosine bridge circuit 310, $V_{SIN}$ is an output signal of the sine bridge circuit 320, $V_{MID}$ is an output signal of the middle bridge circuit 330, A is an amplitude of the angle sensor output signal, φ is related to the angle of the magnetic field in accordance with Equation 1, $V'_{COS}$ is a substitute output signal of the cosine bridge circuit 310 using the output signal $V_{MID}$ of the middle bridge circuit 320, and $V'_{SIN}$ is a substitute output signal of the sine bridge circuit 320 using the output signal $V_{MID}$ of the middle bridge circuit 330.

If the sine bridge circuit 320 fails, then a substitute of the sine signal can be calculated using the cosine bridge circuit 310 and the middle bridge circuit 330 based on Equation 5. Similarly, if the cosine bridge circuit 310 fails, then a substitute of the cosine signal can be calculated using the sine bridge circuit 320 and the middle bridge circuit 330 based on Equation 6. In the end, the microcontroller can apply Equation 1 after substituting the failing bridge circuit according to Equation 5 or 6. Obviously, if the middle bridge circuit 330 fails, the default calculation is done.

In addition, one or more plausibility checks may be performed. These plausibility checks include, for example, a bridge circuit cross check and an extended vector length check, and are typically performed in the microcontroller. These plausibility checks were performed previously, but can now be performed by substituting either the cosine or sine output signal with the middle signal according to Equations 5 and 6 when necessary. More detailed explanations of these plausibility checks follow.

The bridge circuit cross check is based on the following equation:

$$|(V_{COS} + V_{SIN}) - V_{MID} \sqrt{2}| < \delta \quad \text{(Equation 7)}$$

In the case of a phase shift of both the cosine bridge circuit 310 and the sine bridge circuit 320, if the middle bridge circuit 330 suffers from a different or no phase shift, this bridge cross check will detect the failure.

The extended vector length check is a check of length of the radius of a circle shown in FIGS. 3B-3D. This check can now be performed in any of four ways —cosine, sine, cosine replacement using the middle bridge, and sine replacement using the middle bridge. More specifically, the extended vector length check is a determination as to whether the absolute value of the voltage vector is with a predetermined proximity of a target voltage amplitude δ' in accordance with the following equation:

$$|\sqrt{V_{COS}^2 + V_{SIN}^2} - A| < \delta'$$ (Equation 8)

The additional third, middle Wheatstone bridge circuit 330 is thus configured to detect a failure, and this same bridge circuit is also configured to provide a correct value of the external magnetic field angle together with either of the sine and cosine bridges, in case the other falls out.

Further, the cosine Wheatstone bridge circuit 310, the sine Wheatstone bridge circuit 320, and the middle Wheatstone bridge circuit 330 can be combined with the other diversity features described within this disclosure with respect to other embodiments.

Figure 4A:
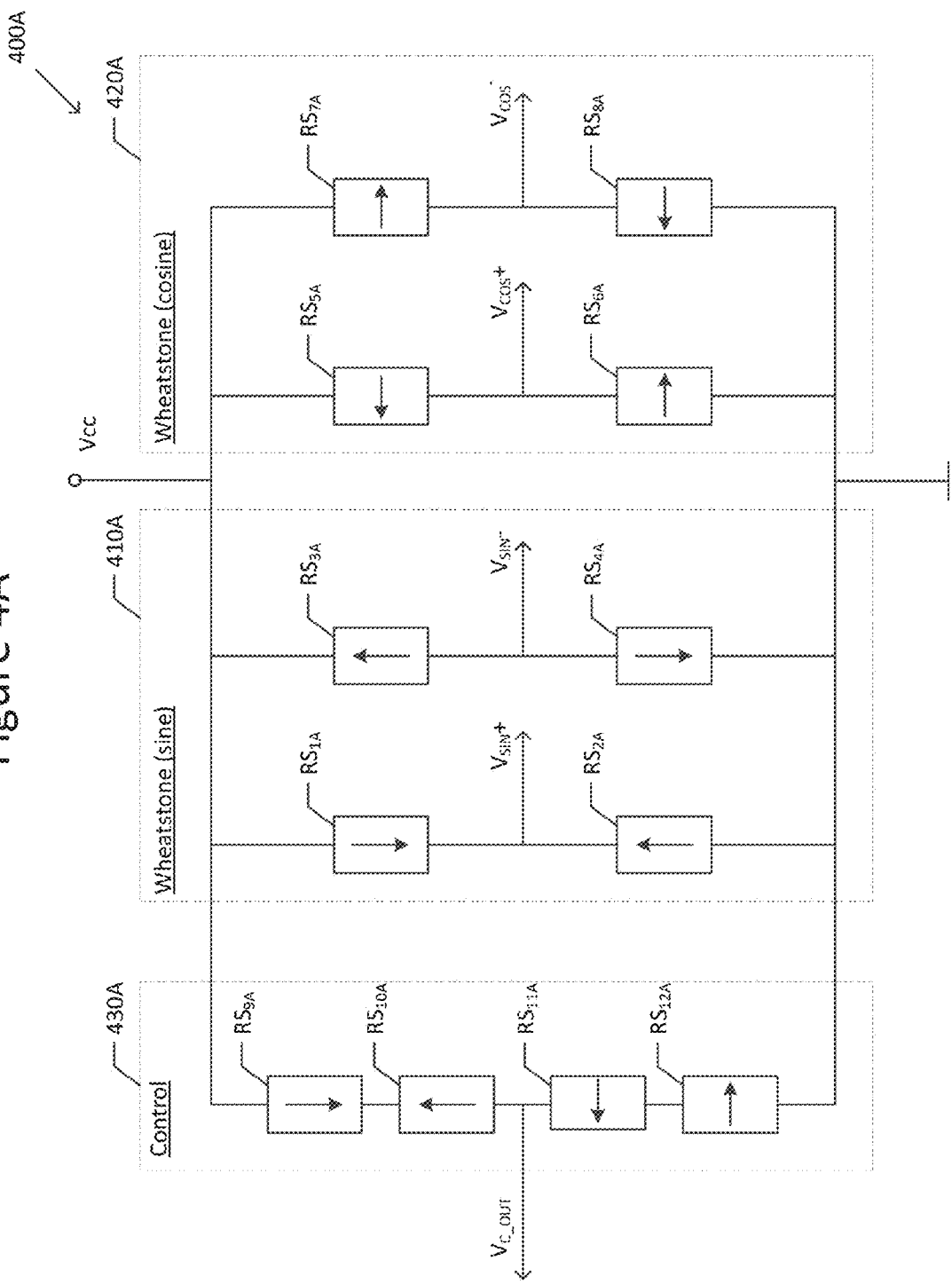
FIGS. 4A-4C illustrate schematic diagrams of magnetic angle sensors in accordance with other exemplary embodiments.
Figure 4B:
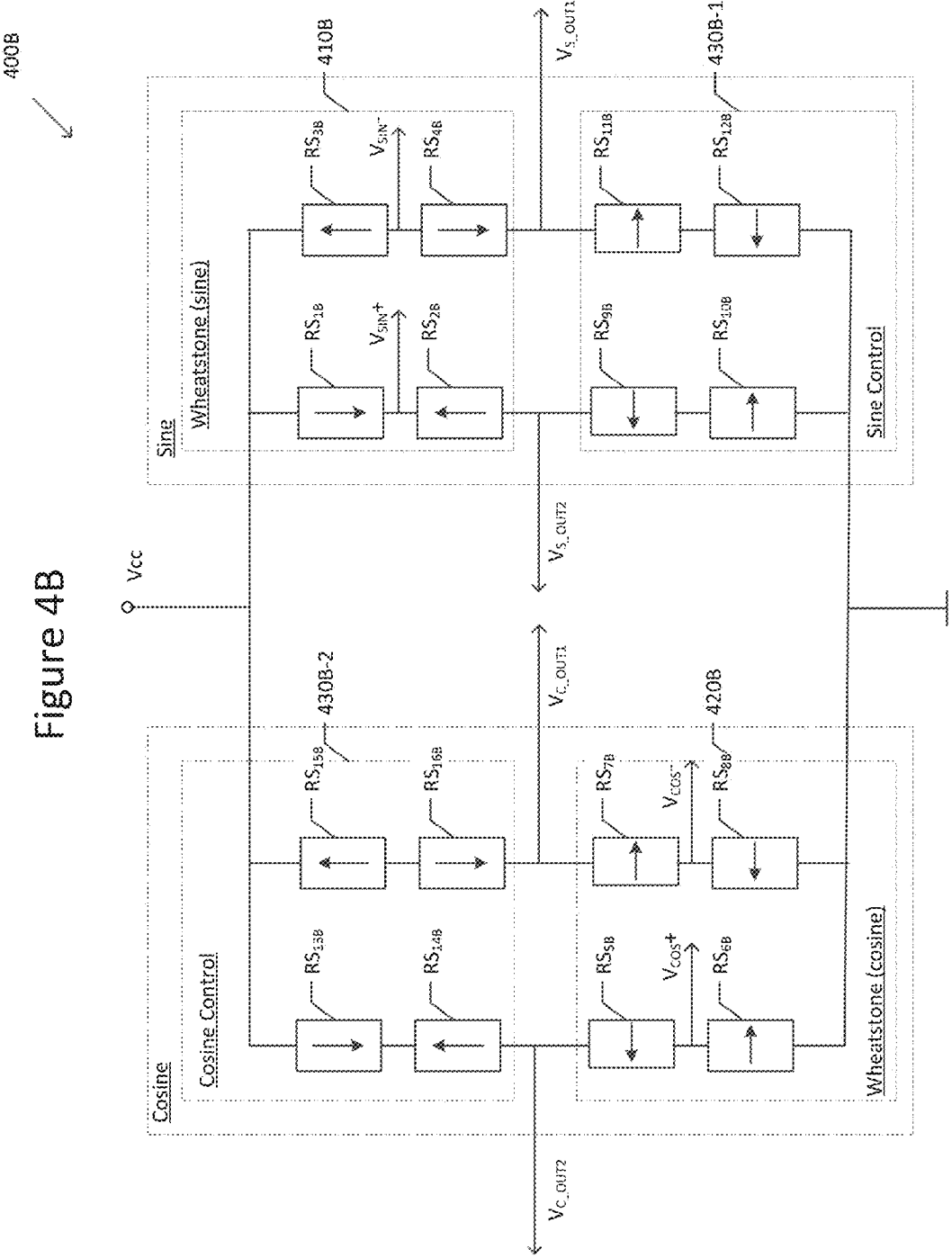
Figure 4C:
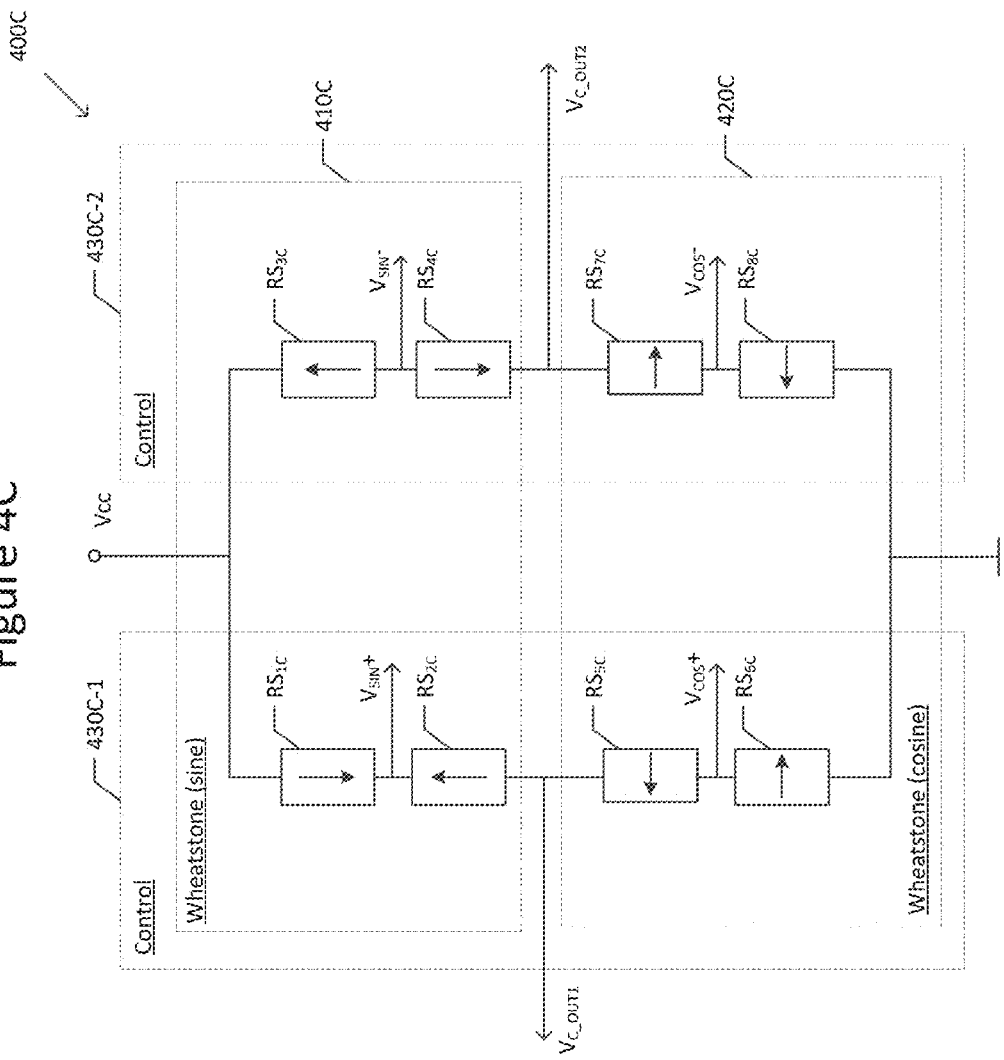

FIGS. 4A-4C illustrate schematic diagrams of magnetic angle sensors 400A-400C in accordance with other exemplary embodiments. The magnetic angle sensor 400 achieves diversity by adding a control circuit 430 configured to detect output errors.

As discussed above, a magnetic angle sensor uses a sine Wheatstone bridge output signal and a cosine Wheatstone bridge output signal to calculate an angle of an external magnetic field. The magnetoresistive elements that make up the Wheatstone bridges have fixed reference magnetization directions. The resistance of a magnetoresistive element depends on the angle of the fixed reference magnetization relative to the external magnetic field. If a magnetoresistive element experiences a drift or change during its lifetime or due to a malfunction, the magnetic angle sensor may produce incorrect output signals.

By way of overview, the control circuit 430 is configured to monitor the magnetoresistive elements to detect any drift or change. Since the function of a magnetic angle sensor is to measure a change of a magnetoresistive element due to an external magnetic field, it is difficult to distinguish between an influence from the external magnetic field and a drift or change. The control circuit 430 is configured to eliminate the effects of the external magnetic field so that lifetime drifts or changes may be detected.

FIG. 4A illustrates a schematic diagram of a magnetic angle sensor 400A in accordance with an exemplary embodiment.

The magnetic angle sensor 400A comprises a first Wheatstone bridge circuit 410A, a second Wheatstone bridge circuit 420A, and a control circuit 430A.

The first Wheatstone bridge circuit 410A is a sine bridge circuit, and comprises magnetoresistive elements $RS_{1A}$-$RS_{4A}$. The first Wheatstone bridge circuit 410A is coupled between supply voltage Vcc and ground, and is configured to output a sine bridge circuit output voltage $V_{SIN}+$, $V_{SIN}-$.

The second Wheatstone bridge circuit 420A is a cosine bridge circuit, and comprises magnetoresistive elements $RS_{5A}$-$RS_{8A}$. The second Wheatstone bridge circuit 420A is also coupled between supply voltage Vcc and ground, and is configured to output a cosine bridge circuit output voltage $V_{COS}+$, $V_{COS}-$.

The control circuit 430A is comprised of an even number of magnetoresistive elements $RS_{9A}$-$RS_{12A}$, in this example, four. The control circuit 430A is also coupled between supply voltage Vcc and ground, and is configured to output a control circuit output voltage $V_{C\_OUT}$.

The magnetoresistive elements RS have reference magnetizations indicated by the arrows as shown. Each of the magnetoresistive elements RS is arranged to be paired with another magnetoresistive element having an opposing reference magnetization directions. More specifically, the magnetoresistive elements $RS_{9A}$ and $RS_{10A}$ are paired and have opposing fixed reference magnetization directions, and similarly, the magnetoresistive elements $RS_{11A}$ and $RS_{12A}$ are paired and have opposing fixed reference magnetization directions. A sum of the resistances of the paired magnetoresistive elements $RS_{9A}$ and $RS_{10A}$ coupled in series between supply voltage Vcc and the mode of the control circuit output voltage $V_{C\_OUT}$ is constant, and a sum of the resistances of the paired magnetoresistive elements $RS_{11A}$ and $RS_{12A}$ coupled in series between the node of the control circuit output voltage $V_{C\_OUT}$ and ground is constant. As a result, the control circuit output voltage $V_{C\_OUT}$ is constant and independent of the external magnetic field direction. Typically, all magnetoresistive elements have a same resistivity, so the control circuit output voltage $V_{C\_OUT}$ is Vcc/2.

The control circuit output voltage $V_{C\_OUT}$ is monitored for a change indicating a failure. If one of the magnetoresistive elements $RS_{9A}$-$RS_{12A}$ of the control circuit 430A shows a change, for example, a drift of reference magnetization, the control circuit output voltage $V_{C\_OUT}$ will also change and may no longer be constant, but may instead oscillate, indicating that the output is no longer reliable.

The control circuit 430A of the magnetic angle sensor 400A of FIG. 4A is comprised of different magnetoresistive elements $RS_{9A}$-$RS_{12A}$ than those of the since and cosine Wheatstone bridge circuits 410A, 420A. If there is a malfunction that affects the sine Wheatstone bridge circuit 410A or cosine Wheatstone bridge circuit 420A but not the control circuit 430A, the error would not be detected. Also, if all of the magnetoresistive elements $RS_{9A}$-$RS_{12A}$ of the control circuit 430A change in a similar manner, the error would not be detected.

FIG. 4B illustrates a schematic diagram of a magnetic angle sensor 400B in accordance with another exemplary embodiment. This magnetic angle sensor 400B differs from the magnetic angle sensor 400A of FIG. 4A in that the control circuit 430B is part of the measurement structure, which includes the sine and cosine Wheatstone bridge circuits 410B, 420B. If any of the magnetoresistive elements of the measurement structure change, then the control circuit output voltage also changes.

The magnetic angle sensor 400B comprises a sine Wheatstone bridge circuit 410B, a cosine Wheatstone bridge circuit 420B, and a control circuit 430B. The control circuit 430B is comprised of two portion —sine control circuit 430B-1 and cosine control circuit 430B-2. The sine Wheatstone bridge circuit 410B and the sine control circuit 430B-1 are coupled in series between supply voltage Vcc and ground, with a node of a first sine control output voltage $V_{S\_OUT1}$ and a node of a second sine control output voltage $V_{S\_OUT2}$ located therebetween. Similarly, the cosine Wheatstone bridge circuit 420B and the cosine control circuit 430B-2 are coupled in series between supply voltage Vcc and ground, with a node of a first cosine control output $V_{C\_OUT1}$ and a node of a second cosine control output $V_{C\_OUT2}$ located therebetween.

The sine Wheatstone bridge circuit 410B comprises four magnetoresistive elements $RS_{1B}$-$RS_{4B}$. The sine Wheatstone bridge circuit 410B is configured to output a sine bridge circuit output voltage $V_{SIN}+$, $V_{SIN}-$.

The sine control circuit 430B-1 is integrated in the sine Wheatstone bridge circuit 410B and is configured to output a sine control output voltage $V_{S\_OUT1}$, $V_{S\_OUT2}$. The sine control circuit 430B-1 comprises magnetoresistive elements $RS_{9B}$-$RS_{12B}$. A first branch of the sine control circuit 430B-1 is coupled in series with a first branch of the sine Wheatstone bridge circuit 410B. Similarly, a second branch of the sine control circuit 430B-1 is coupled in series with a second branch of the sine Wheatstone bridge circuit 410B. More specifically, the first branch of the sine control circuit 430B-1 comprising magnetoresistive elements $RS_{9B}$ and $RS_{10B}$ is coupled in series with the first branch of the sine Wheatstone bridge circuit 410B comprising magnetoresistive elements $RS_{1B}$ and $RS_{2B}$. Similarly, the second branch of the sine control circuit 430B-1 comprising magnetoresistive elements $RS_{11B}$ and $RS_{12B}$, is coupled in series with the second branch of the sine Wheatstone bridge circuit 410B comprising magnetoresistive elements $RS_{3B}$ and $RS_{4B}$. Each of the magnetoresistive elements RS is arranged to be paired with another magnetoresistive element having an opposing reference magnetization (i.e., $RS_{1B}$ and $RS_{2B}$, $RS_{3B}$ and $RS_{4B}$, $RS_{9B}$ and $RS_{10B}$, and $RS_{11B}$ and $RS_{12B}$) Among the magnetoresistive elements in the sine Wheatstone bridge circuit 410B and sine control circuit 430B-1, there are four different reference magnetization orientations.

The cosine Wheatstone bridge circuit 420B comprises magnetoresistive elements $RS_{5B}$-$RS_{8B}$. The cosine Wheatstone bridge circuit 420B is configured to output a cosine bridge circuit output voltage $V_{COS}+$, $V_{COS}-$.

The cosine control circuit 430B-2 is integrated in the cosine Wheatstone bridge circuit 420B and is configured to output a cosine control output voltage $V_{C\_OUT1}$, $V_{C\_OUT2}$. The cosine control circuit 430B-2 comprises magnetoresistive elements $RS_{13B}$-$RS_{16B}$. A first branch of the cosine control circuit 430B-2 is coupled in series with a first branch of the cosine Wheatstone bridge circuit 420B. Similarly, a second branch of the cosine control circuit 430B-2 is coupled in series with a second branch of the cosine Wheatstone bridge circuit 420B. More specifically, the first branch of the cosine control circuit 430B-2 comprising magnetoresistive elements $RS_{13B}$ and $RS_{14B}$, is coupled in series with the first branch of the cosine Wheatstone bridge circuit 420B comprising magnetoresistive elements $RS_{5B}$ and $RS_{6B}$. Similarly, the second branch of the cosine control circuit 430B-2 comprising magnetoresistive elements $RS_{15B}$ and $RS_{16B}$, is coupled in series with the second branch of the cosine Wheatstone bridge circuit 420B comprising magnetoresistive elements $RS_{7B}$ and $RS_{8B}$. Each of the magnetoresistive elements RS is arranged to be paired with another magnetoresistive element having an opposing reference magnetization (i.e., $RS_{5B}$ and $RS_{6B}$, $RS_{7B}$ and $RS_{8B}$, $RS_{13B}$ and $RS_{14B}$, and $RS_{15B}$ and $RS_{16B}$). Among the eight magnetoresistive elements in the cosine Wheatstone bridge circuit 420B and cosine control circuit 430B-2, there are four different reference magnetization orientations.

The sine Wheatstone bridge circuit 410B provides both the sine output voltage $V_{SIN}+$, $V_{SIN}-$ and the sine control output voltage $V_{S\_OUT1}$, $V_{S\_OUT2}$. Similarly, the cosine Wheatstone bridge circuit 410C provides both the cosine output voltage $V_{COS}+$, $V_{COS}-$ and the cosine control output voltage $V_{C\_OUT1}$, $V_{C\_OUT2}$.

During normal operation if there is no malfunction, the magnetoresistive elements $RS_{9B}$-$RS_{16B}$ of the control circuit 430B cancel. The outputs of the sine Wheatstone bridge circuit 410B and the cosine Wheatstone bridge circuit 420B, when there is no control circuit 430B, are symmetric around zero. On the other hand, the control circuit 430B causes the outputs of the sine and cosine Wheatstone bridge circuits 410B, 420B to have an offset, which must be compensated.

The output control voltages ($V_{S\_OUT1}$, $V_{S\_OUT2}$, $V_{C\_OUT2}$, and $V_{C\_OUT1}$) are constant, independent of an external magnetic field direction, unless the magnetic angle sensor 400B malfunctions.

FIG. 4C illustrates a schematic diagram of a magnetic angle sensor 400C in accordance with another exemplary embodiment. A difference between this magnetic angle sensor 400C and the magnetic angle sensor 400B of FIG. 4B is that the control circuit 430C is comprised of the same magnetoresistive elements RS that comprise the sine and cosine Wheatstone bridge circuits 410C, 420C. In this way, the magnetoresistive elements RS which produce the magnetic angle sensor output signal are monitored directly. Also, only two, rather than four, output control voltages must be monitored. Also, The magnetic angle sensor 400C comprises a first Wheatstone bridge circuit 410C, a second Wheatstone bridge circuit 420C, and a control circuit 430C. The first Wheatstone bridge circuit 410C and the second Wheatstone bridge circuit 420C are coupled in series between supply voltage Vcc and ground.

The first Wheatstone bridge circuit 410C is a sine bridge circuit, and comprises magnetoresistive elements $RS_{1C}$-$RS_{4C}$. The first Wheatstone bridge circuit 410C is configured to output a sine bridge circuit output voltage $V_{SIN}+$, $V_{SIN}-$.

The second Wheatstone bridge circuit 420C is a cosine bridge circuit, and comprises magnetoresistive elements $RS_{5C}$-$RS_{8C}$. The second Wheatstone bridge circuit 420C is configured to output a cosine bridge circuit output voltage $V_{COS}+$, $V_{COS}-$.

The control circuit 430C comprises a first control circuit 430C-1 and a second control circuit 430C-2. The control circuit 430C is comprised of the same magnetoresistive elements that comprise the sine and cosine Wheatstone bridge circuits 410C, 420C. More specifically, the first control circuit 430C-1 is comprised of first branches of the sine and cosine Wheatstone bridge circuits 410C, 420C, that is, magnetoresistive elements $RS_{1C}$, $RS_{2C}$, $RS_{5C}$, and $RS_{6C}$. The second control circuit 430C-2 is comprised of second branches of the sine and cosine Wheatstone bridge circuits 410C, 420C, that is, magnetoresistive elements $RS_{3C}$, $RS_{4C}$, $RS_{7C}$, and $RS_{8C}$.

Each of the magnetoresistive elements RS is arranged to be paired with another magnetoresistive element having an opposing reference magnetization direction ($RS_{1C}$ and $RS_{2C}$, $RS_{3C}$ and $RS_{4C}$, $RS_{5C}$ and $RS_{6C}$, and $RS_{7C}$ and $RS_{8C}$). Also, the magnetoresistive elements $RS_{1C}$, $RS_{2C}$, $RS_{5C}$, and $RS_{6C}$ of the first branches of the sine and cosine Wheatstone bridge circuits 410C, 420C each have a different reference magnetization direction. Similarly, the magnetoresistive elements $RS_{3C}$, $RS_{4C}$, $RS_{7C}$, and $RS_{8C}$ of the second branches of the sine and cosine Wheatstone bridge circuits 410C, 420C also each have a different reference magnetization direction.

A control circuit output voltage $V_{C\_OUT}$ is comprised of a first control circuit output voltage $V_{C\_OUT1}$ and a second control circuit output voltage $V_{C\_OUT2}$. The first control circuit output voltage $V_{C\_OUT1}$ is output at a node located between the first branch of the sine Wheatstone bridge circuit 410C and the first branch of the cosine Wheatstone bridge circuit 420C. The second control circuit output voltage $V_{C\_OUT2}$ is output at a node located between the second branch of the sine Wheatstone bridge circuit 410C and the second branch of the cosine Wheatstone bridge circuit 420C.

During a normal operation, the control circuit output voltage $V_{C\_OUT}$ is constant. However, if a resistance of any of the magnetoresistive elements changes due to a lifetime shift or error, the control circuit output voltage $V_{C\_OUT}$ is no longer constant. The outputs of the sine and cosine Wheatstone bridge circuits 410C, 420C have an offset, which must be compensated.

The control circuit 430C of FIG. 4C has a more simplified structure than the control circuit 430B of FIG. 4B in that the control circuit 430 is formed within the first and second Wheatstone bridges 410C, 420C, so there are fewer magnetoresistive elements. Also, only two control output voltages are monitored, as opposed to four, so there are fewer pins.

The control circuit output voltage $V_{C\_OUT}$ of any of the described embodiments may be monitored on an ongoing basis. Alternatively, the control circuit output voltage $V_{C\_OUT}$ may be monitored at period intervals, or at any other time(s) as suitable for the intended purpose.

Further, any of the control circuit 430A, the control circuit 430B, and the control circuit 430C can be combined with the other diversity features described within this disclosure with respect to other embodiments.

Figure 5A:
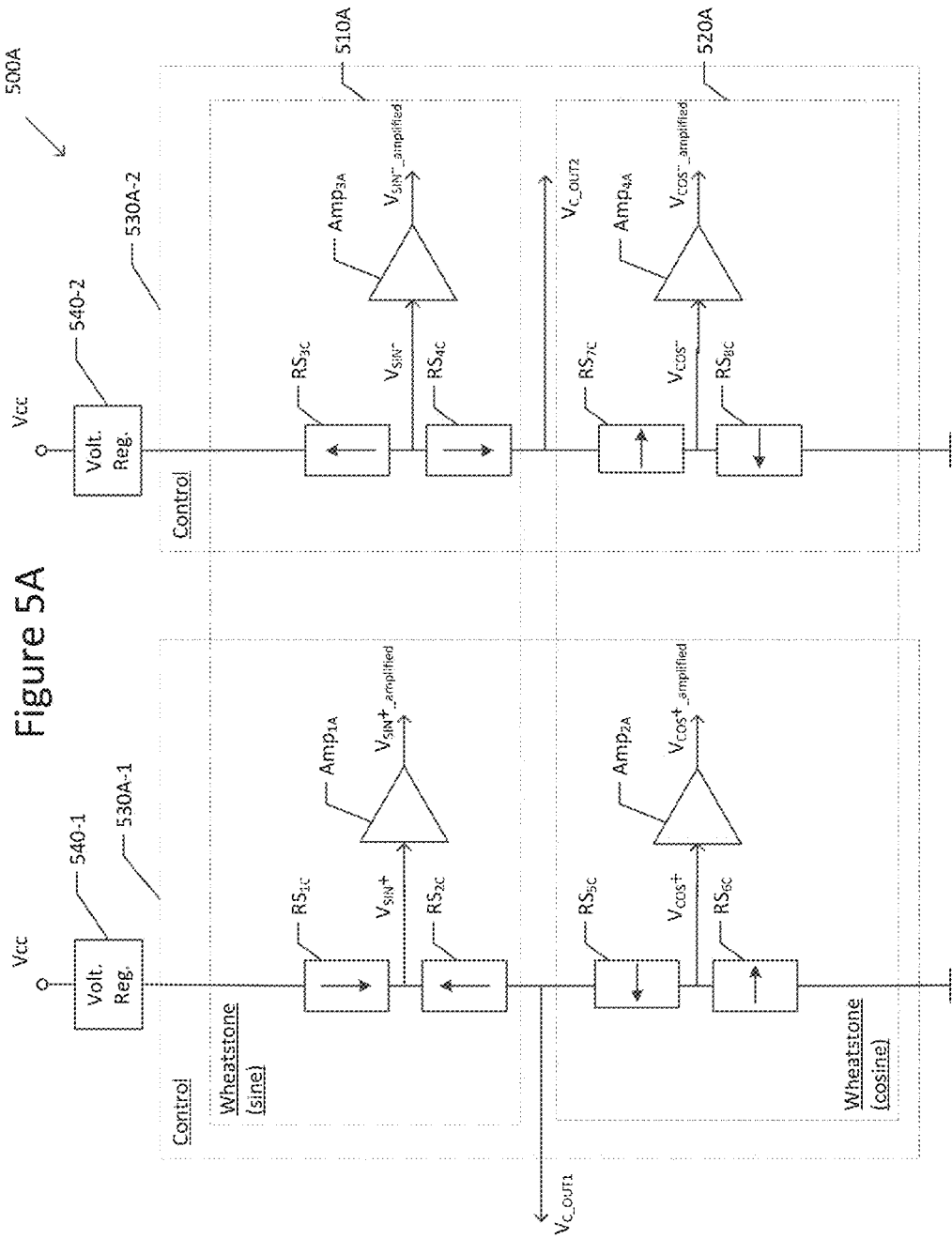
FIGS. 5A-5B illustrate schematic diagrams of magnetic angle sensors in accordance with other exemplary embodiments.
Figure 5B:
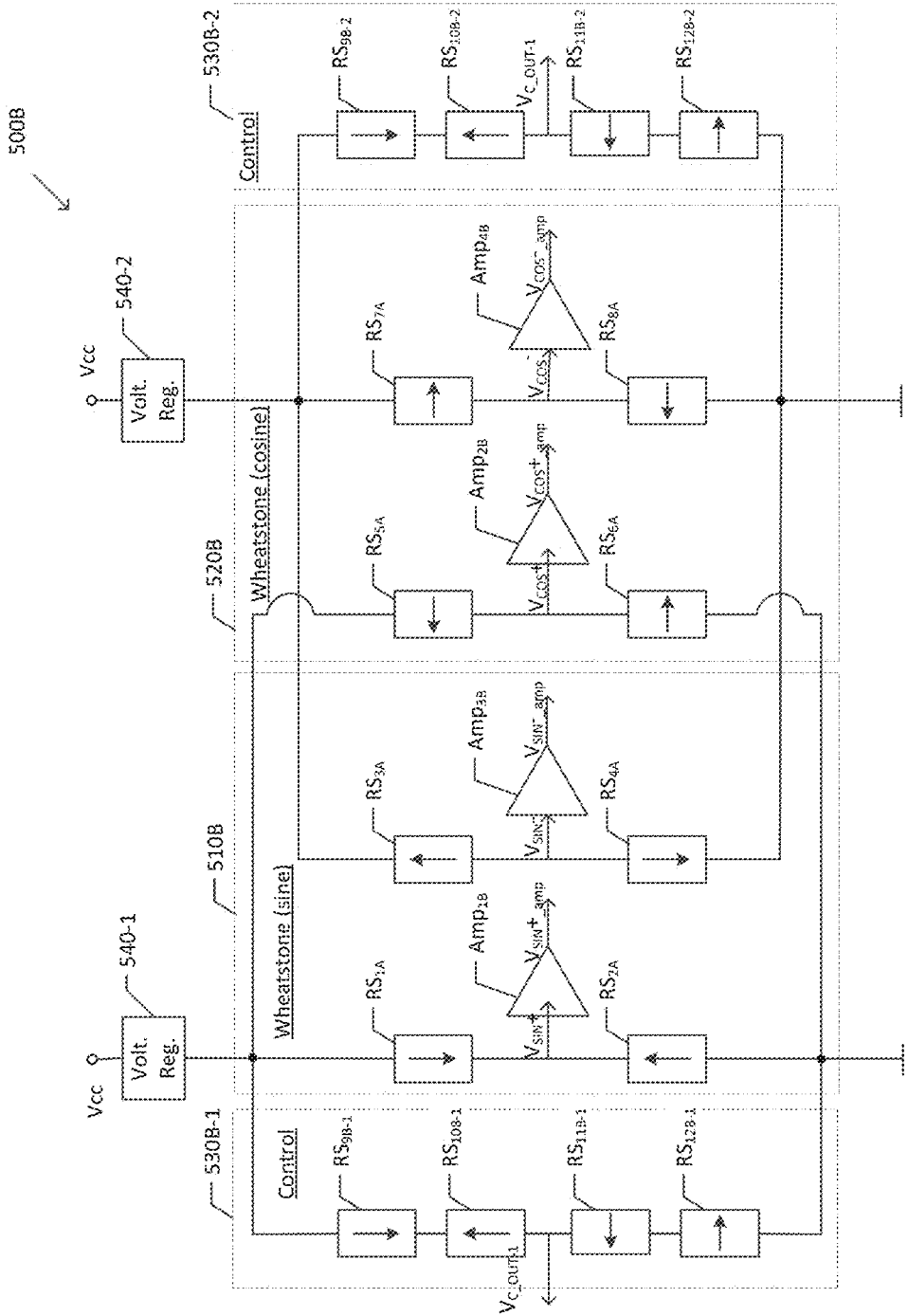

FIGS. 5A-5B illustrate schematic diagrams of magnetic angle sensors 500 in accordance with other exemplary embodiments. The magnetic angle sensors 500 achieve complete channel diversity with an additional voltage regulator 540, and an amplifier Amp coupled at each half-bridge circuit output.

These exemplary embodiments provide redundancy not only at the Wheatstone bridge level, but also for the voltage regulator 540 and amplifiers AMP. Redundancy is therefore provided for the entire magnetic angle sensor channel, which includes at least the voltage regulator 540, the magnetoresistive elements RS of the Wheatstone bridge circuit, and the amplifier AMP.

FIG. 5A is based on the magnetic angle sensor 400C of FIG. 4C. Similar elements have similar reference numerals, in some cases beginning with a "5" for FIG. 5A rather than a "4" from FIG. 4C. For the sake of brevity, descriptions of the similar elements will not be repeated.

The magnetic angle sensor 500A differs from the magnetic angle sensor 400C of FIG. 4C in that rather than being supplied by a single voltage regulator (not shown in FIG. 4C), magnetic angle sensor 500A is supplied by two voltage regulators 540-1 and 540-2. The first voltage regulator 540-1 is configured to supply a first half-bridge circuit (branch with magnetoresistive elements $RS_{1C}$ and $RS_{2C}$) of the first Wheatstone bridge circuit 510A, and a first half-bridge circuit ($RS_{5C}$ and $RS_{6C}$) of the second Wheatstone bridge circuit 520A; the first half-bridge circuit ($RS_{1C}$ and $RS_{2C}$) is a positive sine half-bridge circuit, and the second half-bridge circuit ($RS_{5C}$ and $RS_{6C}$) is a positive cosine half-bridge circuit. The second voltage regulator 540-2 is configured to supply a second half-bridge circuit ($RS_{3C}$ and $RS_{4C}$) of the first Wheatstone bridge circuit 510A, and a second half-bridge circuit ($RS_{7C}$ and $RS_{8C}$) of the second Wheatstone bridge circuit 520A; the second half-bridge circuit ($RS_{3C}$ and $RS_{4C}$) is a negative sine half-bridge circuit, and the second half-bridge circuit ($RS_{7C}$ and $RS_{8C}$) is a negative cosine half-bridge circuit.

The magnetic angle sensor 500A further differs from the magnetic angle sensor 400C of FIG. 4C in that an amplifier AMP is coupled to an output of each half-bridge circuit. A first amplifier $AMP_{1A}$ is configured to amplify an output $V_{SIN+}$ of the positive sine half-bridge circuit ($RS_{1C}$ and $RS_{2C}$). A second amplifier $AMP_{2A}$ is configured to amplify an output $V_{COS+}$ of the positive cosine half-bridge circuit ($RS_{5C}$ and $RS_{6C}$). A third amplifier $AMP_{3A}$ is configured to amplify an output $V_{SIN-}$ of the negative sine half-bridge circuit ($RS_{3C}$ and $RS_{4C}$). A fourth amplifier $AMP_{4A}$ is configured to amplify an output $V_{COS-}$ of the negative cosine half-bridge circuit ($RS_{7C}$ and $RS_{8C}$). In an alternative embodiment, a same amplifier AMP may be configured to amplify both a cosine half-bridge circuit and a sine half-bridge circuit.

If either voltage regulator 540 fails, there may still be a properly functioning sine half-bridge circuit (positive or negative) and a cosine half-bridge circuit (positive or negative, respectively) functioning through 360° for calculating an angle. Functioning through 360° is to say that a full turn of the magnet can be traced without ambiguity as would be the case for an angle sensor functioning through 180°. For example, if voltage regulator 540-1 fails, voltage regulator can still supply the negative sine half-bridge circuit ($RS_{3C}$ and $RS_{4C}$) and the negative cosine half-bridge circuit ($RS_{7C}$ and $RS_{8C}$) and its corresponding control circuit 530A-2. Alternatively, if voltage regulator 540-2 fails, voltage regulator can still supply the positive sine half-bridge circuit ($RS_{1C}$ and $RS_{2C}$) and the positive cosine half-bridge circuit ($RS_{5C}$ and $RS_{5C}$) and its corresponding control circuit 530A-1. If any of the amplifiers AMP or magnetoresistive elements RS fails, there may be a similar scenario of there still being a properly functioning sine half-bridge circuit (positive or negative) and a cosine half-bridge circuit (positive or negative, respectively).

FIG. 5B is based on the magnetic angle sensor 400A of FIG. 4A. Similar elements have similar reference numerals, in some cases beginning with a "5" for FIG. 5B rather than a "4" from FIG. 4A. For the sake of brevity, descriptions of the similar elements will not be repeated.

The magnetic angle sensor 500B differs from the magnetic angle sensor 400A of FIG. 4A in that rather than being supplied by a single voltage regulator (not shown in FIG. 4A), magnetic angle sensor 500B is supplied by two voltage regulators 540-1 and 540-2. The first voltage regulator 540-1 is configured to supply a first half-bridge circuit (branch with magnetoresistive elements $RS_{1A}$ and $RS_{2A}$) of the first Wheatstone bridge circuit 510B, and a first half-bridge circuit ($RS_{5A}$ and $RS_{6A}$) of the second Wheatstone bridge circuit 520B. The first half-bridge circuit ($RS_{1A}$ and $RS_{2A}$) is a positive sine half-bridge circuit, and the second half-bridge circuit ($RS_{5A}$ and $RS_{6A}$) is a positive cosine half-bridge circuit. The second voltage regulator 540-2 is configured to supply a second half-bridge circuit ($RS_{3A}$ and $RS_{4A}$) of the first Wheatstone bridge circuit 510B, and a second half-bridge circuit ($RS_{7A}$ and $RS_{8A}$) of the second Wheatstone bridge circuit 520B. The second half-bridge circuit ($RS_{3A}$ and $RS_{4A}$) is a negative sine half-bridge circuit, and the second half-bridge circuit ($RS_{7A}$ and $RS_{8A}$) is a negative cosine half-bridge circuit.

The magnetic angle sensor 500B further differs from the magnetic angle sensor 400A of FIG. 4A in that an amplifier AMP is coupled to an output of each half-bridge circuit. A first amplifier $AMP_{1A}$ is configured to amplify an output $V_{SIN+}$ of the positive sine half-bridge circuit ($RS_{1A}$ and $RS_{2A}$). A second amplifier $AMP_{2B}$ is configured to amplify an output $V_{COS+}$ of the positive cosine half-bridge circuit ($RS_{5A}$ and $RS_{6A}$). A third amplifier $AMP_{3B}$ is configured to amplify an output $V_{SIN-}$ of the negative sine half-bridge circuit ($RS_{3A}$ and $RS_{4A}$). A fourth amplifier $AMP_{4B}$ is configured to amplify an output $V_{COS-}$ of the negative cosine half-bridge circuit ($RS_{7A}$ and $RS_{8A}$). In an alternative embodiment, a same amplifier AMP may be configured to amplify both a cosine half-bridge circuit and a sine half-bridge circuit.

The control circuit 530B of magnetic angle sensor 500B comprises a first control subcircuit 530B-1 and a second control subcircuit 530B-2. The first control circuit 530B-1 is coupled in parallel with both the positive sine half-bridge circuit ($RS_{1A}$ and $RS_{2A}$) and the positive cosine half-bridge circuit ($RS_{5A}$ and $RS_{6A}$), and includes magnetoresistive elements $RS_{9B-1}$, $RS_{10B-1}$, $RS_{11B-1}$, $RS_{12B-1}$. The second control subcircuit 530B-2 is coupled in parallel with both the negative sine half-bridge circuit ($RS_{3A}$ and $RS_{4A}$) and the negative cosine half-bridge circuit ($RS_{7A}$ and $RS_{8A}$), and includes magnetoresistive elements $RS_{9B-2}$, $RS_{10B-2}$, $RS_{11B-2}$, $RS_{12B-2}$. Each of the first control subcircuit 530B-1 and the second control subcircuit 530B-2 is configured and functions in a manner similar to control circuit 430A of FIG. 4A; for the sake of brevity, their descriptions will not be repeated here.

If either voltage regulator 540 fails, there may still be a properly functioning control subcircuit 530B functioning, as well as a sine half-bridge circuit (positive or negative), and a cosine half-bridge circuit (positive or negative) properly functioning through 360° for calculating an angle. For example, if voltage regulator 540-1 fails, voltage regulator can still supply the negative sine half-bridge circuit ($RS_{3A}$ and $RS_{4A}$) and the negative cosine half-bridge circuit ($RS_{7A}$ and $RS_{8A}$) and control subcircuit 530A-2. Alternatively, if voltage regulator 540-2 fails, voltage regulator can still supply the positive sine half-bridge circuit ($RS_{1A}$ and $RS_{2A}$) and the positive cosine half-bridge circuit ($RS_{5A}$ and $RS_{6A}$) and control subcircuit 530A-2. If any of the amplifiers AMP or magnetoresistive elements RS fails, there may be a similar scenario of there still being a properly functioning sine half-bridge circuit (positive or negative) and a cosine half-bridge circuit (positive or negative, respectively).

The magnetic angle sensor 500B is shown in FIG. 5B as including a control circuit 530B, but the disclosure is not limited in this respect. The control circuit 530B is not required.

Further, the magnetic angle sensor 400B of FIG. 4B may be modified to include a redundant voltage regulator 540 and amplifiers Amp, as discussed above for magnetic angle sensors 500A and 500B. Also, the redundant voltage regulator 540 and amplifiers Amp can be combined with the other diversity features described within this disclosure with respect to other embodiments.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. A magnetic angle sensor, comprising:
   a first Wheatstone bridge circuit having a plurality of first magnetoresistive elements; and
   a second Wheatstone bridge circuit having a plurality of second magnetoresistive elements,
   wherein:
   the plurality of second magnetoresistive elements have diversity with respect to the plurality of first magnetoresistive elements,
   a width of meander stripes of the plurality of second magnetoresistive elements is less than a width of meander stripes of the plurality of first magnetoresistive elements, and
   a ratio of an output signal of the second Wheatstone bridge circuit to an output signal of the first Wheatstone bridge circuit indicates a magnetic field strength.

2. The magnetic angle sensor of claim 1, wherein when the ratio is greater than a predetermined value, the first Wheatstone bridge circuit is in saturation.

3. The magnetic angle sensor of claim 1, wherein the width of the meander stripes of the plurality of first magnetoresistive elements is approximately 10 μm, and the width of the meander stripes of the plurality of second magnetoresistive elements is less than approximately 3 um.

4. The magnetic angle sensor of claim 3, wherein the width of the meander stripes of the plurality of second magnetoresistive elements is less than approximately 1 um.

5. A magnetic angle sensor, comprising:
   a first Wheatstone bridge circuit that is a cosine bridge circuit having a plurality of first magnetoresistive elements;
   a second Wheatstone bridge circuit that is a sine bridge circuit having a plurality of second magnetoresistive elements;
   a third Wheatstone bridge circuit that is a middle bridge circuit having an orientation that is rotated one eighth of a period relative to the sine bridge circuit and is counter-rotated one eighth of a period relative to the cosine bridge circuit; and
   a circuit configured to receive a first output signal of the first Wheatstone bridge, a second output signal of the second Wheatstone bridge, and a third output signal of the third Wheatstone bridge, and to determine based on the first, second, and third output signals whether the first Wheatstone bridge is not functioning properly and whether the second Wheatstone bridge is not functioning properly.

6. The magnetic angle sensor of claim 5, wherein if either of the cosine and sine bridge circuits fails, the middle bridge circuit may substitute for the failed cosine or sine bridge circuit in accordance with the following equations:

$V_{COS} = A \cdot \cos \varphi$, $V_{SIN} = A \cdot \sin \varphi$, $V_{MID} = A \cdot \cos(\varphi - \pi/4) = A/\sqrt{2} \cdot (\cos \varphi + \sin \varphi)$, $V'_{SIN} = \sqrt{2} \cdot V_{MID} - V_{COS}$, and $V'_{COS} = \sqrt{2} \cdot V_{MID} - V_{SIN}$, where $V_{COS}$ is an output signal of the cosine bridge circuit, $V_{SIN}$ is an output signal of the sine bridge circuit, VMID is an output signal of the middle bridge circuit, A is an amplitude of an output signal of the magnetic angle sensor, φ is the angle of the magnetic field, $V'_{COS}$ is a substitute output signal of the cosine bridge circuit using the output signal of the middle bridge circuit, and $V'_{SIN}$ is a substitute output signal of the sine bridge circuit using the output signal of the middle bridge circuit.

7. The magnetic angle sensor of claim 5, further comprising:
   a third Wheatstone bridge circuit having a plurality of third magnetoresistive elements,
   wherein the plurality of third magnetoresistive elements have diversity with respect to first magnetoresistive elements and with respect to the second magnetoresistive elements in that the plurality of third magnetoresistive elements have higher magnetic anisotropy.

8. The magnetic angle sensor of claim 7, wherein the third Wheatstone bridge circuit is a cosine bridge circuit.

9. The magnetic angle sensor of claim 7, wherein the third Wheatstone bridge circuit is a sine bridge circuit.

10. The magnetic angle sensor of claim 7, wherein the width of the meander stripes of each of the plurality of first and second magnetoresistive elements is approximately 10 μm, and the width of the meander stripes of the plurality of third magnetoresistive elements is less than approximately 3 um.

11. The magnetic angle sensor of claim 7, wherein the width of the meander stripes of each if the plurality of first and second magnetoresistive elements is approximately 10 μm, and the width of the meander stripes of the plurality of third magnetoresistive elements is less than approximately 1 um.

12. The magnetic angle sensor of claim 5, wherein the first or second magnetoresistive elements are giant magnetoresistance (GMR) elements, and the one eighth of a period is 45°.

13. The magnetic angle sensor of claim 5, wherein the first or second magnetoresistive elements are tunnel magnetoresistance (TMR) elements, and the one eighth of a period is 45°.

14. The magnetic angle sensor of claim 5, wherein the first or second magnetoresistive elements are anisotropic magnetoresistive (AMR) elements, and the one eighth of a period is 22.5°.

* * * * *

UNITED STATES PATENT AND TRADEMARK OFFICE
CERTIFICATE OF CORRECTION

PATENT NO. : 10,113,884 B2
APPLICATION NO. : 14/840574
DATED : October 30, 2018
INVENTOR(S) : Juergen Zimmer et al.

Page 1 of 1

It is certified that error appears in the above-identified patent and that said Letters Patent is hereby corrected as shown below:

In the Claims

At Column 17, Claim number 1, Line number 59, please delete "angle", therefor.

At Column 18, Claim number 2, Line number 9, please delete "angle", therefor.

At Column 18, Claim number 3, Line number 12, please delete "angle", therefor.

At Column 18, Claim number 4, Line number 17, please delete "angle", therefor.

At Column 18, Claim number 5, Line number 20, please delete "angle", therefor.

At Column 18, Claim number 6, Line number 40, please delete "angle", therefor.

At Column 18, Claim number 7, Line number 62, please delete "angle", therefor.

At Column 19, Claim number 8, Line number 4, please delete "angle", therefor.

At Column 19, Claim number 9, Line number 6, please delete "angle", therefor.

At Column 19, Claim number 10, Line number 8, please delete "angle", therefor.

At Column 19, Claim number 11, Line number 14, please delete "angle", therefor.

At Column 19, Claim number 12, Line number 20, please delete "angle", therefor.

At Column 19, Claim number 13, Line number 24, please delete "angle", therefor.

At Column 19, Claim number 14, Line number 28, please delete "angle", therefor.

Signed and Sealed this
Eleventh Day of December, 2018

Andrei Iancu
*Director of the United States Patent and Trademark Office*